United States Patent
Abbott, Jr. et al.

(10) Patent No.: US 10,680,160 B2
(45) Date of Patent: Jun. 9, 2020

(54) PIEZOELECTRIC THIN FILM STACK

(71) Applicants: Hewlett-Packard Development Company, L.P., Houston, TX (US); State of Oregon on behalf of Oregon State Univ., Corvallis, OR (US)

(72) Inventors: James Elmer Abbott, Jr., Corvallis, OR (US); Peter Mardilovich, Corvallis, OR (US); Brady Gibbons, Corvallis, OR (US); Bryan Alexander Maack, Corvallis, OR (US)

(73) Assignees: Oregon State University, Corvallis, OR (US); Hewlett-Packard Development Company, L.P., Spring, TX (US)

( * ) Notice: Subject to any disclaimer, the term of this patent is extended or adjusted under 35 U.S.C. 154(b) by 864 days.

(21) Appl. No.: 15/026,311

(22) PCT Filed: Oct. 30, 2013

(86) PCT No.: PCT/US2013/067614
§ 371 (c)(1),
(2) Date: Mar. 31, 2016

(87) PCT Pub. No.: WO2015/065397
PCT Pub. Date: May 7, 2015

(65) Prior Publication Data
US 2016/0240769 A1  Aug. 18, 2016

(51) Int. Cl.
*H01L 41/09* (2006.01)
*H01L 41/27* (2013.01)
(Continued)

(52) U.S. Cl.
CPC ...... *H01L 41/0805* (2013.01); *B41J 2/14233* (2013.01); *B41J 2/14274* (2013.01);
(Continued)

(58) Field of Classification Search
CPC .................................................. H01L 41/0805
(Continued)

(56) References Cited

U.S. PATENT DOCUMENTS

| 7,884,531 B2 | 2/2011 | Shibata et al. |
| 8,172,372 B2 | 5/2012 | Fujii et al. |

(Continued)

FOREIGN PATENT DOCUMENTS

| JP | 2007-237717 A | * | 9/2007 |
| JP | 2007237717 A | | 9/2007 |
| JP | 2013080887 | | 5/2013 |

OTHER PUBLICATIONS

International Search Report, Written Opinion, PCT/US2013/067614, dated Jul. 21, 2014.

(Continued)

*Primary Examiner* — Thomas M Dougherty
*Assistant Examiner* — Karen B Addison
(74) *Attorney, Agent, or Firm* — Thorpe, North & Western

(57) ABSTRACT

The present disclosure is drawn to a piezoelectric thin film stack and method of preparing the same. The piezoelectric thin film stack can comprise a substrate with an oxide application surface, a metal oxide adhesive blend layer applied to the oxide application surface, and a piezoelectric film applied directly to the metal oxide adhesive blend layer.

13 Claims, 2 Drawing Sheets

(51) Int. Cl.
*H01L 41/332* (2013.01)
*H01L 41/08* (2006.01)
*B41J 2/16* (2006.01)
*B41J 2/14* (2006.01)
*H01L 41/047* (2006.01)
*H01L 41/187* (2006.01)

(52) U.S. Cl.
CPC ............ *B41J 2/161* (2013.01); *B41J 2/1623* (2013.01); *B41J 2/1626* (2013.01); *B41J 2/1631* (2013.01); *B41J 2/1642* (2013.01); *B41J 2/1645* (2013.01); *H01L 41/0477* (2013.01); *H01L 41/09* (2013.01); *H01L 41/1876* (2013.01); *H01L 41/27* (2013.01); *H01L 41/332* (2013.01); *B41J 2002/14491* (2013.01)

(58) Field of Classification Search
USPC ........................... 310/328, 311; 252/62.9 PZ
See application file for complete search history.

(56) References Cited

U.S. PATENT DOCUMENTS

| | | | |
|---|---|---|---|
| 8,366,259 | B2 | 2/2013 | Fujii et al. |
| 8,446,074 | B2 | 5/2013 | Shibata et al. |
| 2006/0055745 | A1 | 3/2006 | Yagi |
| 2010/0039482 | A1* | 2/2010 | Fujii ................. B41J 2/1612 310/364 |
| 2013/0106930 | A1* | 5/2013 | Lea .................. B41J 2/1753 347/9 |
| 2013/0240871 | A1 | 9/2013 | Shimoda et al. |

OTHER PUBLICATIONS

Nam et al., Fabrication and Piezoelectric Properties of PZT Ceramics Prepared by Partial Oxalate Method, Departments of Electronic Engineering and Materials Science and Engineering Yeungnam University,Kyongsan 712-719.Korea pp. 524-528.

* cited by examiner

PIEZOELECTRIC THIN FILM STACK

CROSS-REFERENCE TO RELATED APPLICATIONS

This application is the U.S. National Stage Entry of PCT Application Number PCT/US2013/067614, filed 30 Oct. 2013, which is hereby incorporated within.

BACKGROUND

Adhesion between various materials in thin film stacks present challenges, particularly in environments where high temperatures, piezoelectric vibration, and certain migrating elements or compounds may be present in nearby layers. The piezoelectric printhead is an example of a MEMS device that can be prepared or used under some of these conditions. In piezoelectric printheads, for example, various layers of metal and non-metal films are stacked and adhered together, and high temperatures, piezoelectric actuation, and migration of ions from layer to layer can be common. For example, in systems that use titanium oxide to bond various layers together, lead containing layers that may be present, such as lead zirconate titanate (PZT), provide a source for lead ion migration through metal electrodes into the titanium oxide, which can undermine the function of the device over time. Furthermore, titanium oxide and other adhesive layers tend to underperform when exposed to high manufacturing temperatures. There are also often extra dielectric layers used to isolate conductive layers from one another that might otherwise be unnecessary if adhesive layers could be developed that were effective for providing appropriate binding strength between layers of different types. Thus, it would be desirable to provide improved adhesives for use in various piezoelectric thin film stacks and other related thin material systems.

DETAILED DESCRIPTION

Figure 1:
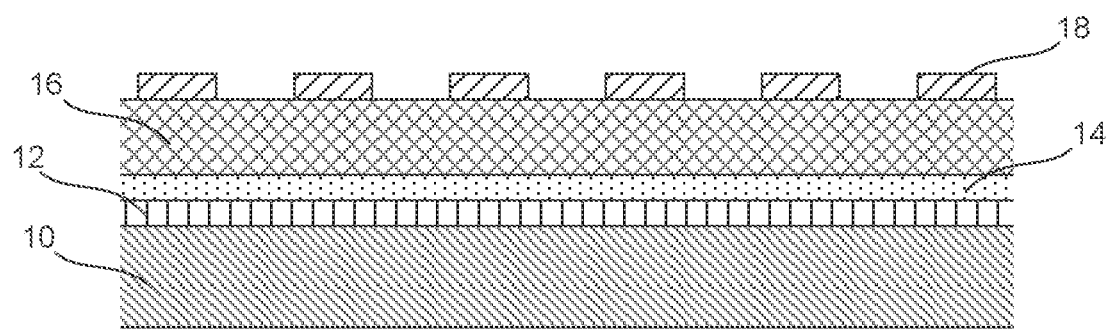
FIG. 1 is a schematic representation of an exemplary piezoelectric thin film stack for use as an actuator or sensor in accordance with examples of the present disclosure.

Piezoelectric devices, such as piezoelectric inkjet printheads or sensors, can be prepared by stacking various piezoelectric materials, other films, and metals, e.g., conductors and/or electrodes, in specific configurations for piezoelectric actuation or piezoelectric sensing. In the case of many microelectromechanical system (MEMS) devices, piezoelectric actuation or sensing can be used for many purposes. To illustrate, with respect to a piezoelectric printhead, the piezoelectric actuator is designed and positioned to act on a chamber (e.g., ink chamber) to eject or jet fluid (e.g., inkjet inks) therefrom. One such piezoelectric film is lead zirconate titanate or PZT, which can be grown or otherwise applied on the surface of a metal layer or electrode, such as platinum, ruthenium, palladium, and iridium, or a conductive and non-conductive layer, such as $IrO_2$, $SrRuO_3$, etc. Furthermore, in accordance with examples of the present disclosure, PZT can also be grown or applied to certain metal oxide adhesive blends. Examples of such blends that are particularly useful include blends of zinc oxide and tin oxide (or ZTO) as well as blends of indium oxide, gallium oxide, and zinc oxide (or IGZO). Others that can also be used include various other blends of zinc oxide, tin oxide, indium oxide, and gallium oxide, such as, for example, indium tin oxide (or ITO), zinc indium oxide (or ZIO), zinc gallium oxide (or ZGO), or gallium tin oxide (or GTO). Thus, a substrate with a metal oxide adhesive blend coated thereon for the subsequent deposition of high quality piezoelectric film, e.g., PZT, and/or metallic conducting layers or features, e.g., platinum, ruthenium, palladium, iridium, $IrO_2$, $SrRuO_3$, etc., has been demonstrated to provide performance and manufacturing benefits. Elemental metals as well as certain conducting or semi-conducting metal oxides are included as "metallic layers or features" as used herein.

In accordance with this, the present disclosure is drawn to a piezoelectric thin film stack, comprising a substrate with an oxide application surface, a metal oxide adhesive blend layer applied to the oxide application surface, and a piezoelectric film applied directly to the metal oxide adhesive blend layer.

Alternatively, a method of preparing a piezoelectric thin film stack can comprise steps of depositing a metal oxide adhesive blend layer to an oxide application surface of a substrate; and depositing a piezoelectric film directly to the metal oxide adhesive blend layer.

In each of the various embodiments described herein, whether discussing the piezoelectric thin film stack devices or related methods, there may be some common features that further characterize options in accordance with principles discussed herein. Thus, any discussion of the thin film stacks or methods, either alone or in combination, is also applicable to the other embodiment not specifically mentioned. For example, a discussion of the metal oxide adhesive blend layer in the context of the thin film stacks is also applicable to the related methods, and vice versa.

Initially, to provide some context, a relatively specific example is provided, but it is to be understood that more general features, ranges, material choices, etc., are included within the scope of the present disclosure. With this in mind, a substrate that can be used can include a semi-conducting substrate, such as a silicon wafer with a 10 nm to 1000 nm thermally grown oxide application surface, e.g., silicon dioxide, applied thereto. Thus, a substrate which includes an oxide application surface can be a membrane or other substrate that is itself an oxide, or which includes a non-oxidized substrate with a thermally or otherwise grown or applied oxide application surface. To the oxide application surface can be applied a 10 nm to 500 nm layer of the aforementioned metal oxide adhesive blend, e.g., a blend of zinc oxide and tin oxide (ZTO) or a blend of indium oxide, gallium oxide, and zinc oxide (IGZO). Thus the term "blend" affirms that multiple metal oxides are present and include metal oxides such as zinc, tin, gallium, indium, etc., e.g., ZTO, IGZO, ITO, ZIO, ZGO, GTO, etc. In one specific example, there at least two metal oxides selected from zinc oxide, tin oxide, gallium oxide, and indium oxide. In another specific example, the metal oxide adhesive blend includes zinc oxide as one of the metal oxides in the blend. The metal oxide adhesive blend layer may be effective for the application of additional layers in its "as-deposited" state, or alternatively, the metal oxide adhesive blend layer can be annealed at temperatures ranging from room temperature to 1000° C. prior to application or subsequent layers, e.g., annealed in a furnace or by a rapid thermal processing system. In one example, the annealing can be at temperatures ranging from 100° C. to 1000° C. In another example, a piezoelectric film, such as PZT, can be applied directly to the surface of the metal oxide adhesive blend layer. In still other examples, the metal oxide adhesive blend layer can also be a direct substrate for application of other conducting metallic layers or features, such as those formed from materials of platinum, ruthenium, palladium, iridium, $IrO_2$, $SrRuO_3$, etc. Thus, there can be structures formed where the metal oxide adhesive blend layer is used as a common support and adhesive material for both a metallic layer or feature, such as an electrode, as well as a piezoelectric film. In another example, the piezoelectric film can be grown on or applied to both a metallic layer or feature as well as to the metal oxide adhesive blend layer. Thus, both the metallic layer or feature as well as the metal oxide adhesive blend layer provide a common substrate to which the piezoelectric film is applied (See FIGS. 2, 4, and 5, for example). Typically, the piezoelectric film is applied in layers, such as by a spinning process, or as a single unitary film, such as via a vacuum deposition process. Either way, the finished piezoelectric film layer can be referred to herein as a piezoelectric "film," whether or not it is applied as multiple layers or during a single deposition process.

It is noted that when referring to various oxides herein, they are used in different contexts. For example, when referring to an "oxide application surface," this refers to the surface of the substrate that includes oxide material suitable for metal oxide adhesive blend layer application. The oxide application surface can be a thermally grown or otherwise applied layer, or the substrate itself can be an oxide that inherently has an oxide surface. Thus, if the substrate is a silicon wafer or substrate, the oxide application surface can be provided by a thermally grown silicon dioxide ($SiO_2$) layer, for example. Other examples of oxide application surfaces include $SrTiO_3$, $LaNiO_3$, $SrRuO_3$, etc. These or other oxides can be deposited as described, or can be deposited by PECVD or PVD deposition processes. In some examples, nitrides or oxynitrides may be used for the electrical isolation layer in addition to the layers described otherwise herein.

On the other hand, when referring specifically to a "metal oxide adhesive blend," what is meant is a blend of two or more metal oxides, such as zinc oxide, tin oxide, gallium oxide, or gallium oxide, and typically, two or more of these specific metal oxides can be blended together. Thus, a blend of zinc oxide and tin oxide, or ZTO, is an example of a metal oxide adhesive blend. Likewise, a blend of indium oxide, gallium oxide, and zinc oxide is another example of a metal oxide adhesive blend, and can alternatively be referred to as IGZO. Others that can also be used include indium tin oxide (or ITO), zinc indium oxide (or ZIO), zinc gallium oxide (or ZGO), or gallium tin oxide (or GTO). Some of the source materials for ZTO, IGZO, or one of these other metal oxide adhesive blends can be in various forms. Indium oxide source material can be in the form of indium sesquioxide ($In_2O_3$) and gallium oxide source material can be in the form of gallium sesquioxide ($Ga_2O_3$). Tin can be in one of a few forms, such as stannous oxide (SnO) or stannic oxide (SnO$_2$). It is noted that when metal oxide adhesive blends are prepared, the source material used to form the blend may not retain its original form in the blend. To illustrate, IGZO can be referred to as $In_2Ga_2ZnO_7$, which is a more complex structure than the discrete components of indium oxide, gallium oxide, and zinc oxide. Likewise, ZTO, in one example, can be referred to as $ZnSnO_3$, which is also a more complex structure than the mere discrete blending of source components. As a result, the term "metal oxide adhesive blend" also includes these more complex structures that are formed upon blending the various metal oxides together. These structures also tend to form when heated, annealed, sintered, or through any other processing steps used to apply these layers to the piezoelectric thin films of the present disclosure.

When calculating the atomic % of individual members of the blend, e.g., zinc oxide and tin oxide; or indium oxide, gallium oxide, and zinc oxide, even though these materials may not retain their discrete molecular form, these components can be calculated as individual elements, or even as the oxides. To illustrate using IGZO, one can determine the atomic % (at %) of the IGZO blend based on the total atomic percentage of each respective element, i.e. indium, gallium, zinc, and oxygen. For example, if a composition includes 100 at % IGZO (with essentially no dopant), then there may be about 16.67 at % indium, about 16.67 at % gallium, about 8.33 at % zinc, and about 58.33 at % oxygen. If there is dopant present (anything other than indium, gallium, zinc, and oxygen in this particular example), then the percentages of each of these elements would decrease accordingly. Other ratios can also be present. On the other hand, when determining the relative atomic percentage of the indium oxide, gallium oxide, and zinc oxide relative to one another, the metal oxide source material can form the basis of the atomic percentage (or molecular percentage of the oxide compound). Thus, in stating that indium oxide is present in the adhesive layer from 3 at % to 94 at %, this means that the indium oxide molecule is present in the adhesive layer at from 3 at % to 94 at % based on source material of the indium oxide and relative to the balance of the composition as a whole. It does not infer that the component has necessarily retained its structure. As a result, in accordance with the present disclosure, atomic percentages can be calculated not only for individual elements, but also for metal oxides, taking into account both the metal content and the oxygen content. This can also be referred to as "molecular percent" but for consistency, atomic percent is used herein throughout and the context will determine whether the percentage is based on the individual element or on the small oxide molecule.

The metal oxide adhesive blend layer can be any metal oxide adhesive blend layer that is effective for application and adhesion of a piezoelectric film, such as PZT, but in certain specific examples, the zinc blend oxide can be ZTO, IGZO, or can be a blend of metal oxides including at least zinc oxide as one of the metal oxides. Other combinations of the metal oxide adhesive blends can likewise be used as previously described. Using zinc tin oxide as an example, the ZTO can be a layer comprising from 3 at % to 97 at % zinc oxide and 3 at % to 97 at % tin oxide, and the zinc oxide and the tin oxide collectively can comprise from 90 at % to 100 at % of the metal oxide adhesive blend layer. IGZO, on the other hand, can be a layer comprising 3 at % to 94 at % indium oxide, from 3 at % to 94 at % gallium oxide, and from 3 at % to 94 at % zinc oxide, and the indium oxide, the gallium oxide, and the zinc oxide can collectively comprise from 90 at % to 100 at % of the metal oxide adhesive blend layer. Other metal oxide adhesive blend layers can be of a similar makeup, i.e. two metal oxide adhesive blends with each metal oxide present at from 3 at % to 97 at %, or three metal oxide adhesive blends with each metal oxide present at from 3 at % to 94 at %, etc., with 90 at % to 100 at % of the layer comprising the metal oxide used in its respective layer.

In additional detail, as mentioned, the metal oxide adhesive blend layer may also be suitable for application of a metallic layer or feature (e.g., electrode) applied directly thereto such that the piezoelectric film and the metallic layer or feature coexist and become adhered to a common metal oxide adhesive blend layer. When a second metallic layer or feature is applied to a top surface of the piezoelectric film, the piezoelectric film can be adapted to provide both piezoelectric actuation and electrical insulation between the first metallic layer or feature feature and the second metallic layer or feature. This can be done without other intervening layers, such as additional dielectric layers often used to electrically insulate pairs of conductive electrodes. The appropriate adhesion of the metal oxide adhesive blend layer to a subsequently applied piezoelectric film and metallic layer or feature can be achieved, even though adhesion to both of these types of materials often may work best under divergent conditions.

It is noted that the "piezoelectric thin film stack" can also be defined to include layers other than those specifically discussed above. For example, there may be additional substrate layers, or additional layers applied to the top of the piezoelectric film, and such layers are within the scope of the present disclosure. As mentioned, a top electrode can be used, but it is worth mentioning that still other electrodes or layers may also be included as part of the thin film stack. Thus, in describing the thin film stack to include the substrate, the oxide application surface, the metal oxide adhesive blend layer, and the piezoelectric film, these layers are merely set forth to state that the thin film stack includes at least these layers, and other layers can also become part of the thin film stack, such as electrodes, insulating layers, semi-conducing layers, etc. Typically, the piezoelectric film can be applied directly to the metal oxide adhesive blend layer, which is essentially a non-conductive layer. It can also be applied to a metallic layer or feature, such as an electrode. Thus, in one example, piezoelectric film can be applied as a common mass or layer to both the metal oxide adhesive blend layer as well as the conducting layer used as an electrode or for some other conducting purpose. In accordance with this, the various blends of zinc oxide, tin oxide, indium oxide, and/or gallium oxide can provide adhesive benefits over other adhesives typically used in the art because of their dielectric properties as well as its versatile adhesive properties.

Turning now to the FIGS., it is noted that the drawings herein are not to be considered as being to scale, and are thus, merely schematic to assist in showing and describing examples of the present disclosure. Furthermore, though an inkjet printhead is shown in some of the FIGS. with various specific layers, it is understood that this is not intended to limit the scope of the present disclosure. This example is merely provided to show an example of the various thin film stacks that can be used in various devices, such as piezoelectric actuators, sensors, or transducers.

FIG. 1 is a schematic representation of an exemplary piezoelectric thin film stack for use as an actuator or sensor in accordance with examples of the present disclosure. In this particular actuator or sensor device, a substrate 10, such as a silicon wafer, having an oxide application surface 12, such as silicon dioxide, is shown. The oxide application surface is suitable to receive and adhere to a metal oxide adhesive blend layer 14, which can be applied with no further processing, i.e. in an "as-deposited" form, or can be annealed at temperatures ranging from room temperature to 1000° C. The metal oxide adhesive blend layer can be ZTO, IGZO, or one of the other blends described herein, for example. In one example, a piezoelectric film 16, such as PZT, can be applied directly to the surface of the metal oxide adhesive blend layer, and then metallic layers or features 18, e.g., platinum, ruthenium, palladium, iridium, $IrO_2$, $LaNiO_3$, $SrRuO_3$, etc. can be applied thereto. In one example, the metallic layer(s) or features(s) can be suitable for use as an electrode(s).

Figure 2:
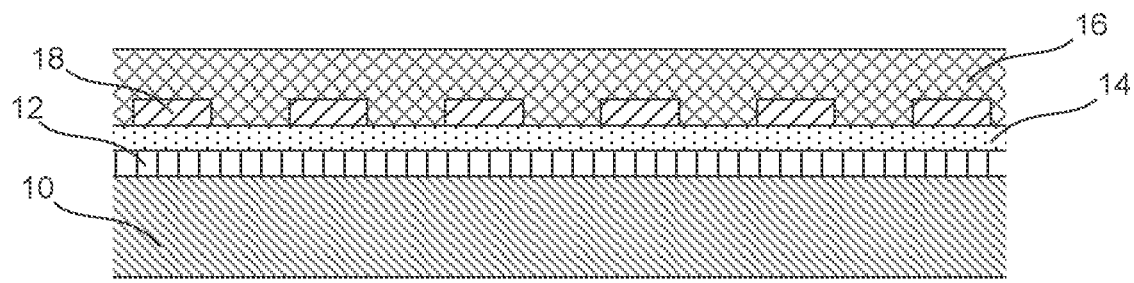
FIG. 2 is a schematic representation of another exemplary piezoelectric thin film stack for use as an actuator or sensor in accordance with examples of the present disclosure.

Conversely, in FIG. 2, the substrate 10, the oxide application surface 12, and the metal oxide adhesive blend layer 14 can be similar in construction to FIG. 1, but in this example, the metal oxide adhesive blend layer can also provide a direct substrate for application of metallic layers or features 18 as well, such as metal or metal oxide elements, e.g., platinum, ruthenium, palladium, iridium, $IrO_2$, $LaNiO_3$, $SrRuO_3$, etc. Thus, there can be structures formed where ZTO, IGZO, or other blends, are used as a common substrate for both a metallic layer or feature, such as an electrode, as well as a piezoelectric film 18.

Figure 3:
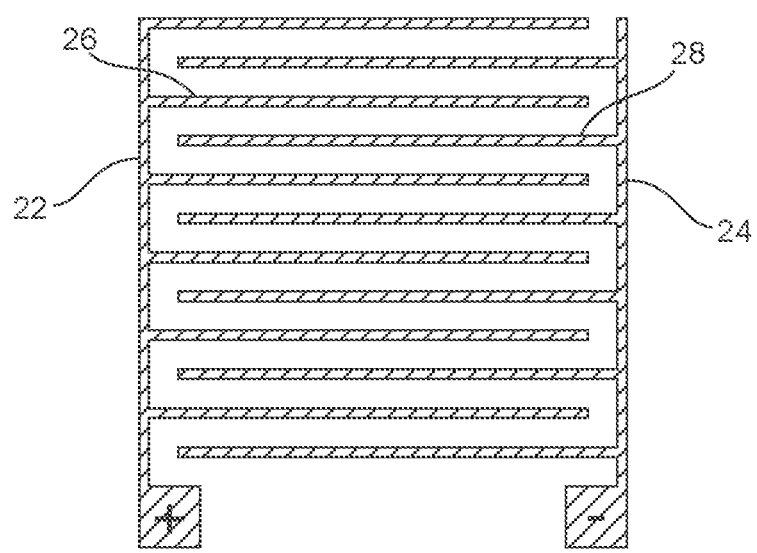
FIG. 3 is a top plan view of a pair of interdigitated electrodes which can be used in accordance with examples of the present disclosure.

FIG. 3 is a top plan view of a pair of interdigitated electrodes which can be used to actuate a piezoelectric material or film, particularly a piezoelectric film that may be in an adjacent layer of a thin film stack. Examples of possible structures where this electrode pair can be used are shown in FIGS. 1 and 2.

The interdigitated electrodes are comprised of a positive electrode 22 and a negative electrode 24, each having digits 26 and digits 28, respectively, that are interlaced as shown. In this configuration, the electrode assembly can be deposited on top of or beneath a piezoelectric film (not shown in this example, but shown in FIGS. 1 and 2).

In accordance with the examples shown in FIG. 1, the piezoelectric thin film is deposited directly on to the metal oxide adhesive blend layer, and the electrodes are applied to the surface of the piezoelectric film. Thus, the elimination of the bottom electrode is possible. By eliminating the bottom electrode, e.g. the electrode beneath the piezoelectric film or layer, a device can be formed that is not dominated by the piezoelectric $d_{31}$ response. That is, the piezoelectric response is dependent on the direction of the applied electric field and the measured displacement. For a $d_{33}$ coefficient, the field applied and the displacement measured are in the same direction. For the $d_{31}$ coefficient, the displacement is measured perpendicular to the applied field. For certain materials, such as PZT, the $d_{33}$ piezoelectric coefficient is much larger than the $d_{31}$ coefficient, thus it can be desirable to fashion a device such that the $d_{33}$ coefficient is the largest contributor to the piezoelectric actuation. In this example, the interdigitated electrodes on the piezoelectric film surface allow the larger $d_{33}$ piezoelectric coefficient to come into play. In more conventional devices, there can be a sandwich structure (metal-piezoelectric-metal) deposited onto a substrate. In this case, the displacement can typically be dominated by the $d_{31}$ response as the field is applied across the piezoelectric, but due to the relatively massive substrate which limits piezoelectric actuation, the displacement is largely kept in the plane of the film (perpendicular to the field). With the materials and layers described herein, development of robust integration methods for piezoelectric PZT thin films on amorphous or polycrystalline oxides can be useful for new piezoelectric thin film integration schemes and device architecture designs.

Figure 4:
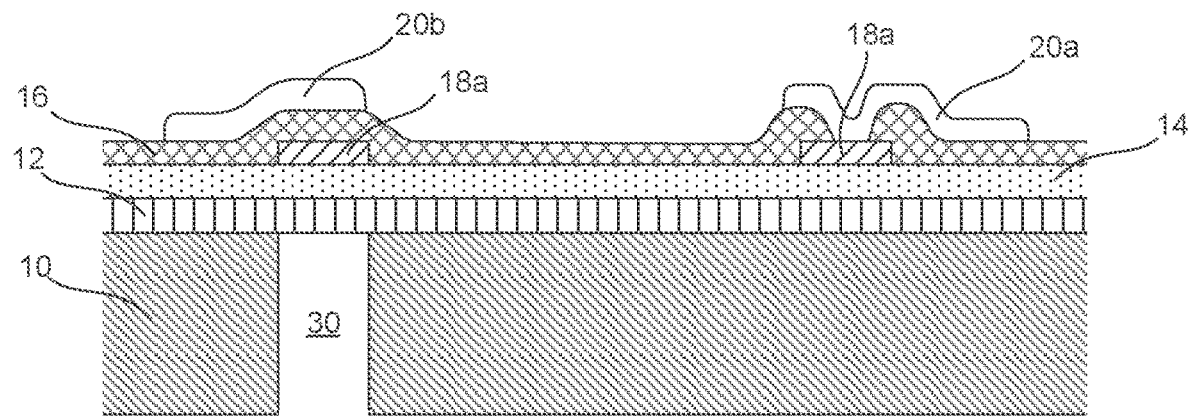
FIG. 4 is a schematic representation of a portion of an exemplary thin film stack in the form of an inkjet printhead, prepared in accordance with examples of the present disclosure.

Turning now to FIG. 4, a schematic representation of a portion of an exemplary thin film stack in the form of an inkjet printhead is shown. In this particular actuator device, a substrate 10, such as a silicon wafer, having an oxide application surface 12, such as silicon dioxide, is shown. The oxide application surface is suitable to receive and adhere to a metal oxide adhesive blend layer 14, which can be applied with no further processing, i.e. in an "as-deposited" form, or can be annealed at temperatures ranging from room temperature to 1000° C. The metal oxide adhesive blend layer can be ZTO, IGZO, or another metal oxide adhesive blend, for example. As shown, the metal oxide adhesive blend layer can provide a direct substrate for application of metallic layers or features 18a, e.g., electrodes comprising platinum, ruthenium, palladium, iridium, $IrO_2$, $LaNiO_3$, $SrRuO_3$, etc., as well as the piezoelectric film, such as PZT. Thus, the ZTO or IGZO or other blend is used as a common substrate for both metallic layers or features as well as a piezoelectric film. The first metallic layer or feature 18a, which act as lower electrodes in this example, are electrically innervated by an electrical trace or conductive pad 20a. In other words, the conductive trace or pad 20a is used to provide electrical communication between a source (not shown) and the first metallic layer or feature. However, in this example, a second conductive trace or pad 20b is used as a second metallic layer or feature, e.g. upper electrode, which provides electrical communication between a source (not shown) and the second metallic layer or feature. In other words, in this example, the second conductive trace or pad acts as both the upper electrode and as a contact pad for an electrical source. To form in the inkjet ink actuation device, a portion of the substrate 10 is removed to leave an ink channel 30 beneath the electrode pair. Thus, when the piezoelectric film is actuated by electrodes, for example, vibrations near the ink channel can cause ink to be ejected therefrom.

Figure 5:
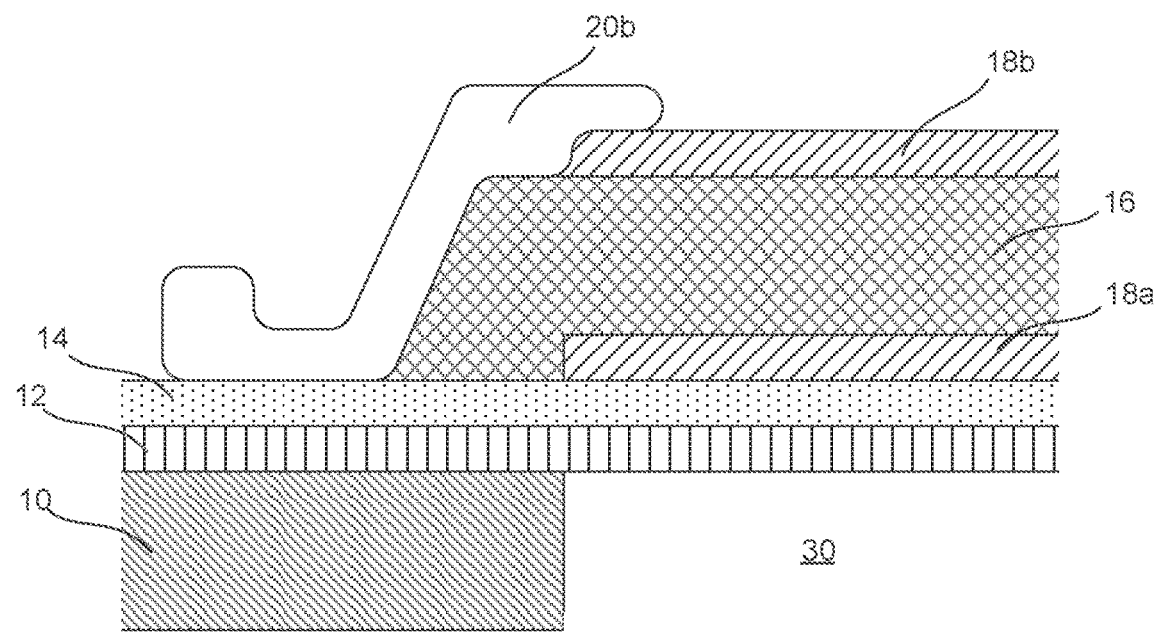
FIG. 5 is another schematic representation of a portion of an exemplary thin film stack in the form of an inkjet printhead, prepared in accordance with examples of the present disclosure.

FIG. 5 provides an example similar to FIG. 4, but FIG. 5 has a dedicated second metallic layer or feature 18b, which acts as the upper electrode. Otherwise, the substrate 10, the oxide application surface 12, the metal oxide adhesive blend layer 14, piezoelectric film 16, the first metallic layer or feature 18a (or bottom electrode), the ink channel 30, etc., are similar. In this example, however, the upper electrode is electrically coupled to an electrical source (not shown) by a bonding pad and trace 20b.

In each of FIGS., the formation of each layer can be carried out in accordance with the knowledge of those skilled in the art after considering the present disclosure. That being stated, as an example, a possible set of deposition steps is provided with respect to FIG. 4 in order to describe how these devices can be generally be prepared. Thus, referring again to FIG. 4, in one example, a thermally oxidized substrate 10, 12, such as a silicon substrate with a silicon dioxide layer, is obtained. Other substrates with oxide application surfaces can also be used. In this example, however, a silicon wafer, for example, can be thermally oxidized to generate a silicon dioxide layer (10 nm to 1000 nm). A metal oxide adhesive blend layer 14 is deposited to the silicon dioxide layer with an optional annealing step from room temperature to about 1000° C. The anneal can be performed in a furnace or in a rapid thermal processing system. A metallic layer, such as platinum, ruthenium, palladium, and iridium, $IrO_2$, $LaNiO_3$, $SrRuO_3$, etc., can then be deposited and annealed or processed further as deposited. Deposition temperature can be appropriate for the specific metal or metal oxide, but a range of 100° C. to 900° C. can be used, for example. A lithographic mask can then be deposited on the metallic layer. This layer can then be etched where unmasked, and the etching is typically stopped at or about the surface of the metal oxide adhesive blend layer, thereby forming a more defined metallic feature 18a, which in this case can be conducting (or semi-conducting) metals or metal oxides. A multistep spin coat deposition or single step vacuum based deposition of PZT can then be carried out on the surface of the metal oxide adhesive blend layer, as well as on the surface of the metallic features to form the piezoelectric film 16. If spin coating, between spin coats, the film can be dried at from about 200° C. to about 500° C. Crystallization of the PZT can be carried out at about 550° C. to about 900° C. These drying and crystallization steps may be performed during or after intermediate layering steps, or alternatively, when all or some spin coats have been completed. If vacuum coating, then a single layer may be dried and crystallized when the film is applied. A lithographic mask can then be used again for opening vias to underlying metallic features by masking all surrounding area except for where the vias are to be generated. The unmasked area is then etched to form the via structure with the etch terminating on the underlying metallization or conductive layer. A top metal layer is typically then deposited on the surface thereof. Again, a lithographic mask is formed on the surface to etch away the portions of the metal layer down to the piezoelectric film that may also act as an interlayer dielectric, thereby forming the top (second) metallic feature 20b, as well as conductive traces/bonding pads 20a, 20b. In this example, it is noted that conductive trace 20b also functions as a top metallic feature, whereas conductive trace 20a is used to provide electrical connection form a source to the first metallic feature 18, which is the lower electrode in this example. In these systems shown in FIGS. 4-5, metallic features 18,20 can be used to generate an electric field with respect to the piezoelectric film 16, and as the piezoelectric film is actuated, the thin film stack vibrates into an appropriate ink chamber 30, causing inkjetting to occur.

As each of these layers are shown in this example, each will be described hereinafter in additional detail, with emphasis placed on the metal oxide adhesive blend layer and its interaction with the piezoelectric film and/or metal elements.

In further detail regarding the substrate, in one example a silicon or other support can be fabricated to include ink chambers for receiving and jetting ink there from. It is noted that often, ink chambers or other areas where ink may contact the printhead can be coated with any of a number of protective coatings.

Those coatings are not shown in the FIGS., but it is understood that such a coating may be used for protective purposes without departing from the scope of the present disclosure. For example, tantalum or tantalum oxide coatings, e.g., $Ta_2O_5$, are often used for this purpose. Other support material(s) can also be used alternatively or in addition to the exemplified silicon support and optional protective coatings. Thus, the term "support" or "substrate" typically includes structures comprising semi-conductive materials such as silicon wafer, either alone or in assemblies comprising other materials applied thereto. Metallic substrates can also be used, including metallic materials with an insulating material applied thereto. Certain specific materials that can be used for the substrate material include silicon, glass, gallium arsenide, silicon on sapphire (SOS), epitaxial formations, germanium, germanium silicon, diamond, silicon on insulator (SOI) material, selective implantation of oxygen (SIMOX) substrates, or other similar materials. Furthermore, as noted, the substrate, whether coated with other materials or not, includes an oxidized surface, which is referred to herein as an oxide application surface, which can be an oxidized layer of the substrate material itself, e.g., $SiO_2$, $ZrO_2$, $HfO_2$, $Ta_2O_5$, $Al_2O_3$, $SrTiO_3$, etc., or can be a separate membrane of oxidized material applied to the substrate, or the substrate itself can be an oxidized material throughout, as long as the surface is oxidized and suitable to receive and become adhered to the metal oxide adhesive blend layer. When the substrate is in the form of a thin layer, film, or membrane, the substrate can be formed at a thickness from 10 Å to 10 µm, for example. In an example piezoelectric actuator device, the thickness of this substrate, e.g., oxidized membrane, can be approximately the same thickness as piezoelectric film, e.g., at a 1:2 to 2:1 thickness ratio of substrate layer to piezoelectric film, and both layers can be about 50 nm or greater. When the substrate is a silicon wafer, for example, any suitable thickness can be used, as the location of the piezoelectric actuator will typically be present where a portion or all of the silicon support is removed to form an ink chamber.

In further detail with respect to the metal or metal oxide elements, these elements are typically formed by applying metal layers and etching away areas to leave metal elements of desired properties and sizes. Furthermore, these metal elements can be electrodes, metal traces, bonding pads, etc., and can be applied at a thickness from 5 nm to 5 microns, though thicknesses outside this range can also be used. Materials that can be used, particularly for electrodes, typically include noble metals or other metals or alloys, including but not limited to, platinum, copper, gold, ruthenium, iridium, silver, nickel molybdenum, rhodium, and palladium. In other examples, oxides of these or other metals can also be used, such as $IrO_2$, $LaNiO_3$, or $SrRuO_3$, if the adhesive properties of the adhesion layers of the present disclosure would be beneficial for use. Platinum is of particular interest as a metal that benefits from the adhesive metal oxide adhesive blend layers of the present disclosure because its surface does not become readily oxidized. Metal electrodes (or metals applied for another purpose, such as for conductive layers, bonding pads, or traces) can be deposited using any technique known in the art, such as sputtering, evaporation, growing the metal on a substrate, plasma deposition, electroplating, etc.

Regarding the piezoelectric material or film described herein, the metal elements usually include metal electrodes. These electrodes should be those which can effectively cause appropriate movement of the piezoelectric films, and retain good adherence during use. To illustrate, in one example, the piezoelectric film can comprise lead zirconate titanate (PZT). By applying PZT to two types of substrates, i.e. the metallic layer or feature and the metal oxide adhesive blend layer, acceptable adhesion between the PZT and the metallic layer or feature and acceptable adhesion between the PZT and the metal oxide adhesive blend layer should be present during normal use so that delamination is avoided at these interfacing surfaces. Furthermore, as PZT contains lead, and lead cations are migratory though other metals under the proper conditions, there can be problems associated with lead migrating into and through the metal electrode, e.g., lead migrates fairly readily through platinum when a titanium oxide adhesive layer is applied to the opposite side of the metal electrode. This is believed to occur because after annealing platinum and titanium oxide during the manufacturing process, especially at high temperatures, lead cations will diffuse into or through the platinum and into the titanium oxide, forming lead titanate ($PbTiO_3$). Thus, in accordance with examples of the present disclosure, by using a metal oxide adhesive blends described herein, there can be decreased migration of lead cations through the metal electrode compared to similar systems utilizing titanium oxide adhesive.

As mentioned, with respect to inkjet printheads or fluid ejection systems, the piezoelectric film or layer is typically disposed between electrodes and receives drop firing and non-firing signals from a controller acting on the electrodes. Alternatively, as shown in FIGS. 1-3, interdigitated electrodes can be used on one side of the piezoelectric material or film. Either way, the electrodes are actively driven to actuate the piezoelectric film, thereby causing ink to flow from the ink chamber to a drop forming outlet or orifice. The inkjet ink is thus jetted toward a print medium or other transfer surface or device. During this firing process, piezoelectric actuators often can be fired up to 100 billion cycles, or even higher, which even at relatively low temperatures, e.g., less than 100° C., may lead to delamination if the adhesion between the layers is not acceptable. The adhesive metal oxide adhesive blend layers of the present disclosure work well and do not suffer from undue delamination. Furthermore, during manufacture of certain piezoelectric devices, very high temperatures are often used, e.g., exceeding 500° C., 700° C., or even 1000° C. Thus, lead cation diffusion from a piezoelectric film, such as PZT, into/through a metal electrode, such as platinum, can be relatively quick and problematic. As mentioned, this is particularly problematic when titanium oxide is used as the adhesive on the opposite side of the metal electrode as the PZT, and use of the adhesive metal oxide adhesive blends of the present disclosure provide a solution to this problem.

As mentioned at length, suitable material for the piezoelectric film layer that can be used include lead zirconium titanate (PZT). In general, with respect to PZT, the general formula can be $Pb(Zr_{1-x}Ti_x)O_3$, where x is from 0.1 to 0.9. However, it is notable that different dopants can be used, such as La, Nb, etc. Thus, other materials for the piezoelectric film can also be used, including lead lanthanum zirconium titanate (PLZT, or La doped PZT), lead niobium zirconium titanate (PNZT, or Nb doped PZT), or PMN-PT (Pb(Mg, Nb)$O_3$—$PbTiO_3$). Lead-free piezoelectric films may also be used, examples of which include $LiNbO_3$, BCTZ [$Ba(Ti_{0.8}Zr_{0.2})O_3$—$(Ba_{0.7}Ca_{0.3})TiO_3$], tungsten bronze structured ferroelectrics (TBSF), BNT-BT [$(Bi_{0.5}Na_{0.5})TiO_3$—$BaTiO_3$], BT [$BaTiO_3$], AlN, AlN doped with Sc, or ternary compositions in the BKT-BNT-BZT [$(Bi_{0.5}K_{0.5})TiO_3$—$(Bi_{0.5}Na_{0.5})TiO_3$—$Bi(Zn_{0.5}Ti_{0.5})O_3$] system, a specific example of which includes 0.4 $(Bi_{0.5}K_{0.5})TiO_3$-0.5$(Bi_{0.5}Na_{0.5})TiO_3$-0.1$Bi(Zn_{0.5}Ti_{0.5})O_3$). Still others can include BNT-BKT-BMgT or BNT-BKT-BNiT. Other suitable piezoelectric materials can be used for the piezoelectric film, or combinations of materials or multiple layers can likewise be used in accordance with examples of the present disclosure.

Turning now to more specific detail regarding the metal oxide adhesive blend layer, as mentioned, this layer can comprise a blend of various metal oxides, such as zinc oxide, tin oxide, gallium oxide, and/or indium oxide. One example of a metal oxide adhesive blend is a blend of zinc oxide and tin oxide (ZTO). Another example of a metal oxide adhesive blend is a blend of indium oxide, gallium oxide, and zinc oxide (IGZO). Others are also listed and described herein, such as indium tin oxide (ITO), zinc indium oxide (ZIO), zinc gallium oxide (ZGO), or gallium tin oxide (GTO), among others. When applied, the metal oxide adhesive blend layer is typically present at a thickness from 10 Å to 0.5 µm, and often, applied at a thickness ranging from 50 Å to 1000 Å.

Regarding ZTO specifically, this blend can applied at an atomic ratio of about 20:1 to about 1:20 based on the atomic ratio of the metal cation. In another example, the blend of zinc oxide and tin oxide can be applied at an atomic ratio of 10:1 to 1:5 based on the atomic ratio of the metal cation. In still another example, the zinc oxide to tin oxide atomic ratio can be about 2:1 based on the atomic ratio of the metal cation. More generally, the zinc oxide and the tin oxide can each be present in the adhesive from 3 at % to 97 at % based on the metal oxide content. In another example, the zinc oxide and tin oxide can each be present in the adhesive from 10 at % to 80 at %, based on the metal oxide content. In still another example, the zinc oxide and the tin oxide can each be present in the adhesive from 20 at % to 60 at %, based on the metal oxide content.

Regarding IGZO specifically, this blend can be applied at various atomic ratios (again based on the atomic ratio of the metal cation). In one example, this blend can applied at a zinc to gallium atomic ratio of about 20:1 to about 1:20, a zinc to indium atomic ratio of about 20:1 to about 1:20, and a gallium to indium atomic ratio of about 20:1 to about 1:20 based on the atomic ratio of the metal cation. Alternatively, this IGZO blend can applied at a zinc to gallium atomic ratio of about 10:1 to about 1:5, a zinc to indium atomic ratio of about 10:1 to about 1:5, and a gallium to indium atomic ratio of about about 10:1 to about 1:5 based on the atomic ratio of the metal cation. In one specific example, an atomic blend of indium to gallium to zinc can be about 2:2:1. Typically, this blend, based on the oxides, e.g., indium oxide to gallium oxide to zinc oxide, will be about 1:1:1 because IGZO typically has a general blend formula of about $In_2Ga_2ZnO_7$. More generally, the indium oxide, the gallium oxide, and the zinc oxide can each be present in the adhesive from 3 at % to 94 at % based on the metal oxide content. In another example, the indium oxide, the gallium oxide, and the zinc oxide can each be present in the adhesive from 10 at % to 80 at %, based on the metal oxide content. In still another example, the indium oxide, the gallium oxide, and the zinc oxide can each be present in the adhesive from 20 at % to 60 at %, based on the metal oxide content.

Dopant(s) can be included in the metal oxide adhesive blend layer as well, and such dopants can include compounds such as Pb, Sb, Fe, Cu, Ca, In, Ga, Cd, Ge, Ti, etc. A dopant is defined as any material added to any layer ranging from 0.05 at % to less than 3 at % (atomic percent). Multiple dopants can be present, and thus, can exceed 3 at % cumulatively in some cases. With respect to the metal oxide adhesive blend layer, zinc oxide, tin oxide, indium oxide, gallium oxide, or the like, are not considered to be dopants by definition. Thus, in the metal oxide adhesive blend layer, any cation or other atom included that is other than zinc, tin, indium, gallium, or oxygen, should be considered as a dopant unless it is present at greater that 3 at % and is a metal oxide.

In further detail regarding the metal oxide adhesive blend layer, it is noted that the blend of metal oxides can be amorphous when prepared under some conditions. As an amorphous compound, the adhesion blend promotes uniform mechanical performance, typically produces an atomically smooth interface, and provides acceptable barrier properties to lead and other impurities that may migrate into the adjacent electrode. However, with respect to certain blends of metal oxides, particularly IGZO, even at higher temperatures where some crystallization begins to occur, e.g., about 28% by volume at 1000° C. in one example, the crystallization tends to occur in the center of the layer, leaving the outer surfaces of the adhesive blend to remain in a more amorphous state. Thus, even at 1000° C., when crystallization occurs fairly significantly, the crystallization remains primarily in the central region, which causes the amorphous surfaces of the adhesive layer to remain smooth and adhesive to the respective layers to which they are bound. As a result, the metal oxide adhesive blend layers of the present disclosure provide reliable adhesion between many noble and other metallic materials, as well as between oxide application surfaces and piezoelectric materials. In short, these metal oxide adhesive blends are fairly versatile with respect to their adhesive properties over a wide variety of materials. Furthermore, these blends provide a reliable adhesion mechanism for adhering noble metals to non-metallic and/or piezoelectric films to membranes or other substrates with oxide surfaces, while remaining thermally stable at higher temperature than many other adhesion layer materials. Additionally, the thin film stacks can be made to be very robust with respect to piezoelectric thin film integration, they can provide enhanced flexibility due to the ability to take advantage of $d_{33}$ actuation mode, and with these structures, there is the ability to use a piezoelectric thin film as both an actuation element and an interlayer dielectric. Each of the advantages alone or in combination can be realized in many of the structures described herein.

Another advantage of the adhesive layer of the present disclosure is related to surface roughness, i.e. maintaining a relatively high level of smoothness, even at very high manufacturing temperatures. Generally, as processing temperatures are increased, the surface roughness can increase as well. However, with the adhesive metal oxide adhesive blend layers of the present disclosure, the surface roughness, even with very high annealing temperatures, e.g. 1000° C. or more in some instances, can be low enough to still be effective for processing and use. For example, when ZTO is annealed at 1000 C.° for one hour, a 6 nm RMS roughness is observed and an even lower roughness is observed when the material was annealed for a shorter time using Rapid Thermal Processing (RTP). This demonstrates the roughness suppression that is provided by this adhesive layer material. More specifically for comparison purposes, this surface roughness was similar to that observed for many non-heated sputter deposited metal films of similar thickness that have not been annealed, which was unexpected. Thus, when attaching a substrate to a metal electrode, such as a silicon dioxide layer to a platinum electrode, surface smoothness that can be maintained over a wide variety of processing conditions can be useful.

With respect to the various layers described herein, any of a number of deposition methods or techniques can be used. For example, as mentioned, a PZT layer can be grown on or otherwise applied to the surface of the metal oxide adhesive blend layer. Deposition techniques that can be used for depositing piezoelectric film or other layers on top of one another include sol-gel deposition, physical vapor deposition (PVD), pulsed laser deposition (PLD), atomic layer deposition (ALD), etc. Metal can be deposited on the metal oxide adhesive blend layer, for example, by sputtering or other known deposition methods. Semi-conductive, non-conductive, or passivation layers can be deposited by plasma enhanced chemical vapor deposition (PECVD), a low pressure chemical vapor deposition (LPCVD), an atmosphere pressure chemical vapor deposition (APCVD), atomic layer deposition (ALD), sputter deposition, evaporation, thermal oxide deposition, or other known methods. Any combination of these or other methods can be used. When applying PZT or another piezoelectric film to a surface where portions are of the metal oxide adhesive blend layer and other portions are of a metal element, deposition properties that overlap in a manner suitable for both application substrates can be considered. For example, if PZT can be suitable applied to an IGZO layer under a range of conditions, and the same PZT can be applied suitably to a platinum electrode element under another range of conditions, then overlapping condition parameters, where possible, can be used to provide the appropriate adhesion of the PZT to both surfaces. See FIG. 4 for an example of an embodiment where PZT is applied as a continuous film over both a metal oxide adhesive blend layer in some areas and a metal element in other areas. Thus, for example, the piezoelectric film is PZT and can be grown or otherwise applied on the IGZO or ZTO and the platinum electrode layer by layer (if sol-gel is used) or the entire PZT film can be deposited at one time in case of physical vapor deposition (PVD), pulsed laser deposition (PLD), or combinations thereof, for example. Other piezoelectric materials can likewise or alternatively be applied, as has been described previously.

EXAMPLES

The following examples illustrate properties of the present disclosure.

However, it is to be understood that the following are only exemplary or illustrative of the application of the principles of the present devices and methods. Numerous modifications and alternative devices and methods may be devised by those skilled in the art without departing from the spirit and scope of the present compositions and methods. The appended claims are intended to cover such modifications and arrangements. Thus, while the present examples have been described above with particularity, the following provides further detail in connection with what are presently deemed to be the acceptable embodiments.

Example 1

A piezoelectric thin film actuator or sensor is prepared similar to that shown in FIG. 1, as follows. A silicon wafer with a silicon dioxide layer on an upper surface is obtained. To the silicon dioxide layer is deposited a 0.1 μm layer of IGZO which is annealed at about 1000° in a furnace. To the IGZO layer, a vacuum deposited layer of PZT is applied at 600° by RF-magnetron sputtering, pulsed DC sputtering, pulsed laser deposition, or other suitable vacuum deposition technique. For sputtering techniques a background gas pressure of 50 mTorr is used. For pulsed laser deposition, a background gas pressure of 200 mTorr is used. A 0.5 μm layer of elemental indium is then applied to the PZT layer at a temperature of about 500° and annealed at 500° for 10 minutes in flowing oxygen. A lithographic mask is applied to areas of the metal layer that are to be protected from etching, i.e. where the elemental Pt upper metal elements are to be retained, and the remaining metal (the unmasked portion) is etched away down to the PZT layer. Once the mask is removed, the upper metal elements or electrodes remain. The upper metal elements can be in the shape of the interdigitated electrodes shown in FIG. 3, or in some other useful configuration, depending on the application.

Example 2

A piezoelectric thin film actuator or sensor is prepared similar to that shown in FIG. 2, as follows. A silicon wafer with a silicon dioxide layer on an upper surface is obtained. To the silicon dioxide layer is deposited a 1 μm layer of ZTO which is annealed at about 800° in a rapid thermal processing system. A 0.15 μm layer of elemental platinum is then applied to the ZTO layer at a temperature of about 500° and annealed at 1000° for 5 minutes. A lithographic mask is applied to areas of the platinum layer that are to be protected from etching, i.e. where the elemental platinum lower electrodes are to be retained, and the remaining platinum (the unmasked portion) is etched away down to the ZTO layer. Once the mask is removed, the lower electrodes remain as deposited on the ZTO layer. To the ZTO/platinum substrate, multiple layers of PZT are spin coated at 3000 rpm and dried at 300° C. When spin coating multiple layers, it is noted that a drying step can be carried out layer by layer, or after multiple layers are applied. In one example, drying can be carried out at every layer (layer by layer), and crystallization can be carried out likewise layer by layer, or after X number of layers, or after all layers are applied. Once the PZT is fully applied, crystallization of the PZT is carried out at 700° C. This temperature is selected as it is provides acceptable adhesion to both the ZTO substrate and the deposited platinum lower electrodes formed in the previous step.

Example 3

A piezoelectric thin film actuator or sensor is prepared similar to that shown in FIG. 4, as follows. A silicon wafer with a silicon dioxide layer on an upper surface is obtained. To the silicon dioxide layer is deposited a 0.1 μm layer of IGZO which is annealed at about 800° C. A 0.5 μm layer of elemental Ir is then applied to the IGZO layer at a temperature of about 500° C. and annealed at 1000° C. for 10 minutes. A lithographic mask is applied to areas of the metal layer that are to be protected from etching, i.e. where the elemental Pt lower metal elements or electrodes are to be retained, and the remaining metal (the unmasked portion) is etched away down to the IGZO layer. Once the mask is removed, the lower metal elements or electrodes remain. To the IGZO/metallic element layer, multiple spin coated layers (at 3000 rpm) of PZT are applied, which are dried at 300° C. and crystallized at 700° C. In order to provide metal traces and/or bonding pads for the already deposited lower electrodes, vias can be opened by etching the PZT over the lower electrodes so that in later steps, metal traces/bonding pads can be formed that contact the lower electrodes. To do this, other areas of the PZT can be masked as described above. Next, another metal layer is applied to the surface of the PZT (and the via). Thus, by masking the portions of the metal layer to be removed, an upper electrode and bonding pad can be formed, as well as a metal trace and bonding pad for the lower electrode can be formed. Etching may be achieved by either wet or dry etch processes. Dry etch is typically used for Pt and most PZT applications, but this is not required. In this configuration, the PZT layer acts as both the material that causes movement of the inkjet actuator, as well as provides insulation between the lower and upper electrodes. Once the piezoelectric thin film stack is formed (or at any appropriate stage prior to completion), in the case of an inkjet ink actuator, an ink channel can be formed in the silicon substrate by removing a portion of the silicon substrate to form the channel. This can be carried out by a deep silicon dry etch process.

Example 4

A 2:1 atomic ratio blend of zinc oxide and tin oxide (ZTO, $Zn_2SnO_4$) adhesive was prepared for use with thin films of SiO$_2$. The purpose of this study was to demonstrate the inherent thermal stability of the blends of zinc oxide and tin oxide in thin film stacks. The structure was subjected to annealing temperatures up to 1000° C. in a furnace and in an RTP (rapid thermal annealing) tool with rates of heating of 10° C./min and 50° C./sec, respectively. Duration was 1 hour in a furnace and 10 min in RTP. The surface roughness was evaluated using Atomic Force Microscopy (AFM), and characterized as Root Mean Square (RMS) Roughness, nm. The surface roughness of the ZTO after a 1000° C. Rapid Thermal Anneal is below 1 nm. A 100 nm platinum layer deposited on the annealed ZTO layer and a portion etched away. These structures demonstrated acceptable thermal stability. PZT precursor solution was then spin cast on to these substrates at 3000 rpm. This layer is then dried at 300° C. for 5 minutes. This is repeated for 4 layers, then the stack is crystallized at 700° C. for 10 minutes in an open atmosphere. This 4 layer procedure is repeated 3 times to achieve PZT thin films approximately 1 μm thick.

Example 5

A 1:1:1 molecular ratio blend of indium oxide, gallium oxide, and zinc oxide (IGZO, In$_2$Ga$_2$ZnO$_7$), by metal oxide molecular ratio adhesive, was prepared and its interaction with thin film SiO$_2$ was investigated. The purpose of this study was to demonstrate the inherent thermal stability of the blends of indium oxide, gallium oxide, and zinc oxide in thin film stacks. The structure was subjected to annealing temperatures up to 1000° C. in a furnace and in an RTP (rapid thermal annealing) tool with rates of heating of 10° C./min and 50° C./sec, respectively. The duration was 0.5 hour in a furnace and 10 min in RTP. The surface roughness was evaluated using Atomic Force Microscopy (AFM), and characterized as Root Mean Square (RMS) Roughness, nm. The surface roughness of the IGZO after annealing in a furnace at 1000° C. is about 1.1 nm. IGZO roughness after RTP at 1000° C. was even lower, around 0.5 nm. To this substrate, PZT precursor solution is then spin cast on to these substrates at 3000 rpm. This layer is then dried at 300° C. for 5 minutes. This was repeated for 4 layers, then the stack is crystallized at 700° C. for 10 minutes in an open atmosphere. This 4 layer procedure is repeated 3 times to achieve PZT thin films approximately 1 μm thick.

While the disclosure has been described with reference to certain embodiments, those skilled in the art will appreciate that various modifications, changes, omissions, and substitutions can be made without departing from the spirit of the disclosure. It is intended, therefore, that the present disclosure be limited only by the scope of the following claims.

What is claimed is:

1. A piezoelectric thin film stack, comprising a substrate with an oxide application surface, a metal oxide adhesive blend layer applied to, the oxide application surface, and a piezoelectric film applied directly on and adhered to the metal oxide adhesive blend layer.

2. The piezoelectric thin film stack of claim 1, wherein the metal oxide adhesive blend layer includes from 3 at % to 97 at % zinc oxide and 3 at % to 97 at % tin oxide, and wherein the zinc oxide and the tin oxide collectively comprise from 90 at % to 100 at % of the metal oxide adhesive blend layer.

3. The piezoelectric thin film stack of claim 1, wherein the metal oxide adhesive blend layer includes from 3 at % to 94 at % indium oxide, from 3 at % to 94 at % gallium oxide, and from 3 at % to 94 at % zinc oxide, and wherein the indium oxide, gallium oxide, and zinc oxide collectively comprise from 90 at % to 100 at % of the metal oxide adhesive blend layer.

4. The piezoelectric thin film stack of claim 1, wherein the piezoelectric film is lead zirconate titanate (PZT).

5. The piezoelectric thin film stack of claim 1, further including a first metallic layer or feature applied directly to the metal oxide adhesive blend layer such that the piezoelectric film and the metallic layer or feature coexist on a common metal oxide adhesive blend layer.

6. The piezoelectric thin film stack of claim 5, further comprising a second metallic layer or feature applied to the piezoelectric film, and wherein the piezoelectric film is adapted to provide both piezoelectric actuation and electrical insulation between the first metallic layer or feature and the second metallic layer or feature.

7. The thin film stack of claim 5, wherein the first metallic layer or feature is a metal or metal oxide electrode from 5 nm to 5 microns in thickness, and is selected from the group of platinum, ruthenium, palladium, iridium, IrO$_2$, and SrRuO$_3$.

8. The piezoelectric thin film stack of claim 1, further comprising a pair of electrodes both present on a common surface of the piezoelectric film, wherein the electrodes are positioned and adapted to generate piezoelectric actuation or sensing using the piezoelectric material.

9. The piezoelectric thin film stack of claim 1, wherein the piezoelectric thin film stack is an actuator for a fluid ejection device.

10. The thin film stack of claim 1, wherein the metal oxide adhesive blend layer includes at least two metal oxides selected from the group consisting of zinc oxide, tin oxide, gallium oxide, and indium oxide.

11. The piezoelectric thin film stack of claim 1, further comprising a pair of interdigitated electrodes each having interlaced digits deposited on top of the piezoelectric film, wherein the pan of interdigitated electrodes allow a $d_{33}$ piezoelectric coefficient to dominate over a $d_{31}$ piezoelectric coefficient response of the piezoelectric film by eliminating an electrode between the piezoelectric film and the metal oxide adhesive layer.

12. The piezoelectric thin film stack of claim 1, further comprising a pair of interdigitated electrodes each having interlaced digits deposited on top of the metal oxide adhesive layer, wherein the pair of interdigitated electrodes allow a $d_{33}$ piezoelectric coefficient to dominate over a $d_{31}$ piezoelectric coefficient response of the piezoelectric film by eliminating an electrode on top of the piezoelectric film.

13. The piezoelectric thin film stack of claim 12 wherein the piezoelectric film comprises lead zirconate titanate (PZT).

* * * * *